(12) United States Patent
Park

(10) Patent No.: US 12,134,336 B2
(45) Date of Patent: Nov. 5, 2024

(54) SYSTEM METHOD FOR BATTERY DIAGNOSIS ACCORDING TO ALTITUDE USING ATMOSPHERIC PRESSURE SENSOR

(71) Applicant: LG ENERGY SOLUTION, LTD., Seoul (KR)

(72) Inventor: Doo Jin Park, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 48 days.

(21) Appl. No.: 18/021,960

(22) PCT Filed: Nov. 5, 2021

(86) PCT No.: PCT/KR2021/016083
§ 371 (c)(1),
(2) Date: Feb. 17, 2023

(87) PCT Pub. No.: WO2022/098181
PCT Pub. Date: May 12, 2022

(65) Prior Publication Data
US 2023/0391224 A1    Dec. 7, 2023

(30) Foreign Application Priority Data
Nov. 9, 2020 (KR) .................. 10-2020-0148733

(51) Int. Cl.
| | |
|---|---|
| *B60L 58/10* | (2019.01) |
| *G01C 5/06* | (2006.01) |
| *G01R 31/367* | (2019.01) |
| *G01R 31/3842* | (2019.01) |

(52) U.S. Cl.
CPC .............. *B60L 58/10* (2019.02); *G01C 5/06* (2013.01); *G01R 31/367* (2019.01); *G01R 31/3842* (2019.01)

(58) Field of Classification Search
None
See application file for complete search history.

(56) References Cited

U.S. PATENT DOCUMENTS

| | | | |
|---|---|---|---|
| 2012/0249053 A1 | 10/2012 | Seethaler et al. | |
| 2014/0002027 A1* | 1/2014 | Guan | H02J 7/0014 |
| | | | 320/128 |
| 2020/0035082 A1 | 1/2020 | Lee et al. | |

FOREIGN PATENT DOCUMENTS

| | | |
|---|---|---|
| JP | 2007-185074 A | 7/2007 |
| JP | 6206370 B2 | 10/2017 |
| JP | 2018-98032 A | 6/2018 |

(Continued)

OTHER PUBLICATIONS

International Search Report (PCT/ISA/210) issued in PCT/KR2021/016083, dated Feb. 15, 2022.

*Primary Examiner* — Jas A Sanghera
(74) *Attorney, Agent, or Firm* — Birch, Stewart, Kolasch & Birch, LLP

(57) ABSTRACT

The present invention relates to an altitude-dependent battery diagnosis system and method using a barometric pressure sensor, and relates to a battery diagnostic system and method of differently setting the diagnostic level and algorithm according to the altitude, diagnosing the state of the battery pack based on the diagnostic algorithm corresponding to the current altitude and precisely monitoring and diagnosing the state of the battery pack that changes according to the altitude.

10 Claims, 2 Drawing Sheets

(56) References Cited

FOREIGN PATENT DOCUMENTS

| | | |
|---|---|---|
| JP | 2018-152926 A | 9/2018 |
| JP | 2020-88904 A | 6/2020 |
| JP | 2020-88993 A | 6/2020 |
| KR | 10-2014-0002494 A | 1/2014 |
| KR | 10-2018-0103626 A | 9/2018 |
| KR | 10-1983986 B1 | 5/2019 |
| KR | 10-2054925 B1 | 12/2019 |
| KR | 10-2092324 B1 | 3/2020 |

* cited by examiner

| ALTITUDE(m) | 0 | 500 | 1000 | 1500 | 2000 | 2500 | 3000 | 4000 | 5000 |
|---|---|---|---|---|---|---|---|---|---|
| DIAGNOSTIC LEVEL | LV1 | LV2 | LV3 | LV4 | LV5 | LV6 | LV7 | LV8 | LV9 |

SYSTEM METHOD FOR BATTERY DIAGNOSIS ACCORDING TO ALTITUDE USING ATMOSPHERIC PRESSURE SENSOR

CROSS REFERENCE TO RELATED APPLICATIONS

This application is the National Phase of PCT/KR2021/016083 filed on Nov. 5, 2021, which claims priority under 35 U.S.C. § 119 (a) to Korean Patent Application No. 10-2020-0148733 filed in the Republic of Korea on Nov. 9, 2020, all of which are hereby expressly incorporated by reference into the present application.

TECHNICAL FIELD

The present invention relates to an altitude-dependent battery diagnosis system and method using a barometric pressure sensor, and more particularly, to a system and method for diagnosing a battery state by applying an algorithm according to an altitude measured through a barometric pressure sensor.

BACKGROUND ART

A battery pack, which is a rechargeable power supply device for supplying power to an electric motor, and a Battery Management System (BMS), which is a management system for monitoring and controlling the operating state of the battery pack, are mounted in a Light Electric Vehicle (LEV) that may be used for short-distance movement such as electric scooters or electric bicycles.

In general, a Light Electric Vehicle (LEV) BMS diagnoses states such as overcharge, overdischarge, and overcurrent of a battery pack using measured voltage, current, and temperature values of the battery pack based on a single diagnostic algorithm.

Unlike electric vehicles, a Light Electric Vehicle (LEV) have the advantage of being easy to operate even in areas with geographical characteristics such as high-altitude areas or narrow and steep alleys, and thus are widely used at high altitudes.

On the other hand, since the effect of gravity is different according to height due to atmospheric pressure, atmospheric pressure appears differently depending on height. Due to this, when operating LEVs at high altitude, in the battery pack mounted therein, a change in battery characteristics such as rapid discharge or expansion occurs due to a change in atmospheric pressure according to an elevation in altitude.

However, since the existing LEV BMS diagnoses the state of the battery pack based on a certain single diagnostic algorithm, there is a problem in that it cannot accurately cope with the state of the battery pack because it does not reflect the battery characteristics that vary depending on the altitude.

(Patent Document 1) KR2092324 B1

DISCLOSURE OF THE INVENTION

Technical Problem

An object of the present invention is to solve the above problems, and to provide a diagnostic system and method capable of diagnosing the state of a battery pack in consideration of changes in battery characteristics according to altitude.

Technical Solution

A system for diagnosing the state of the battery pack according to the altitude according to the present invention includes a battery pack including at least two battery cells connected in series/parallel; a barometric pressure sensor mounted at any one position of the battery pack to measure an external atmospheric pressure state at regular intervals; an altitude information calculation unit configured to calculate altitude information using an atmospheric pressure measurement value input from the barometric pressure sensor; a first storage unit configured to store a lookup table including diagnostic level information corresponding to of a plurality of atmospheric pressure sections; a second storage unit configured to store predetermined diagnostic reference range data corresponding to each diagnostic level information; a diagnostic level extraction unit configured to extract a diagnostic level corresponding to a current altitude value calculated by the altitude information calculation unit from the lookup table stored in the first storage unit; and a diagnostic unit configured to diagnose a current state of the battery pack by applying predetermined diagnostic reference range data corresponding to the diagnostic level extracted from the diagnostic level extraction unit among the diagnostic reference range data stored in the second storage unit.

Moreover, the system further includes a pack state information measurement unit configured to measure voltage, current, and temperature states of the battery pack at regular intervals, wherein the diagnostic unit is configured to diagnose the current state of the battery pack by using the voltage, current, and temperature values measured by the pack state information measurement unit based on the diagnostic reference range data corresponding to the diagnostic level extracted from the diagnostic level extraction unit.

Here, the state of the battery pack is configured to include at least one of overcharge, overdischarge, and overcurrent.

Moreover, the diagnostic reference range data stored in the second storage unit are differentially set according to each diagnostic level.

Here, the diagnostic reference range data includes reference data for diagnosing at least one state of overcharge, overdischarge, and overcurrent of the battery pack.

A method of diagnosing the state of the battery pack according to the altitude according to the present invention includes: an atmospheric pressure state measurement step of measuring an atmospheric pressure state at regular intervals in a barometric pressure sensor mounted at a predetermined position of the battery pack; an altitude value calculation step of calculating an altitude value using an atmospheric pressure measurement value measured in the atmospheric pressure state measurement step; a diagnostic level extraction step of extracting a diagnostic level corresponding to the altitude value calculated in the altitude value calculation step from a lookup table including a diagnostic level corresponding to each altitude section provided in advance; and a pack state diagnostic step of diagnosing a current state of the battery pack based on diagnostic reference range data corresponding to the diagnostic level extracted in the diagnostic level extraction step among the diagnostic reference range data corresponding to each diagnostic level provided in advance.

Furthermore, the method further includes a pack state information measurement step of measuring voltage, current, and temperature states of the battery pack at regular intervals, wherein the pack state diagnostic step is a step of diagnosing the state of the current battery pack using the voltage, current, and temperature values measured in the pack state information measurement step based on the diagnostic reference range data corresponding to the diagnostic level extracted in the diagnostic level extraction step.

Here, the diagnostic reference range data are differentially set according to each diagnostic level.

Moreover, the state of the battery pack is configured to include at least one of overcharge, overdischarge, and overcurrent.

Furthermore, the diagnostic reference range data includes reference data for diagnosing at least one state of overcharge, overdischarge, and overcurrent of the battery pack.

Advantageous Effects

According to the present invention, the diagnostic level/algorithm is differentially set according to the altitude, and the state of the battery pack is diagnosed by applying the diagnostic level/algorithm corresponding to the current altitude value.

Accordingly, it is possible to effectively respond to battery characteristics that vary according to altitude.

MODE FOR CARRYING OUT THE INVENTION

Figures 1, 2:
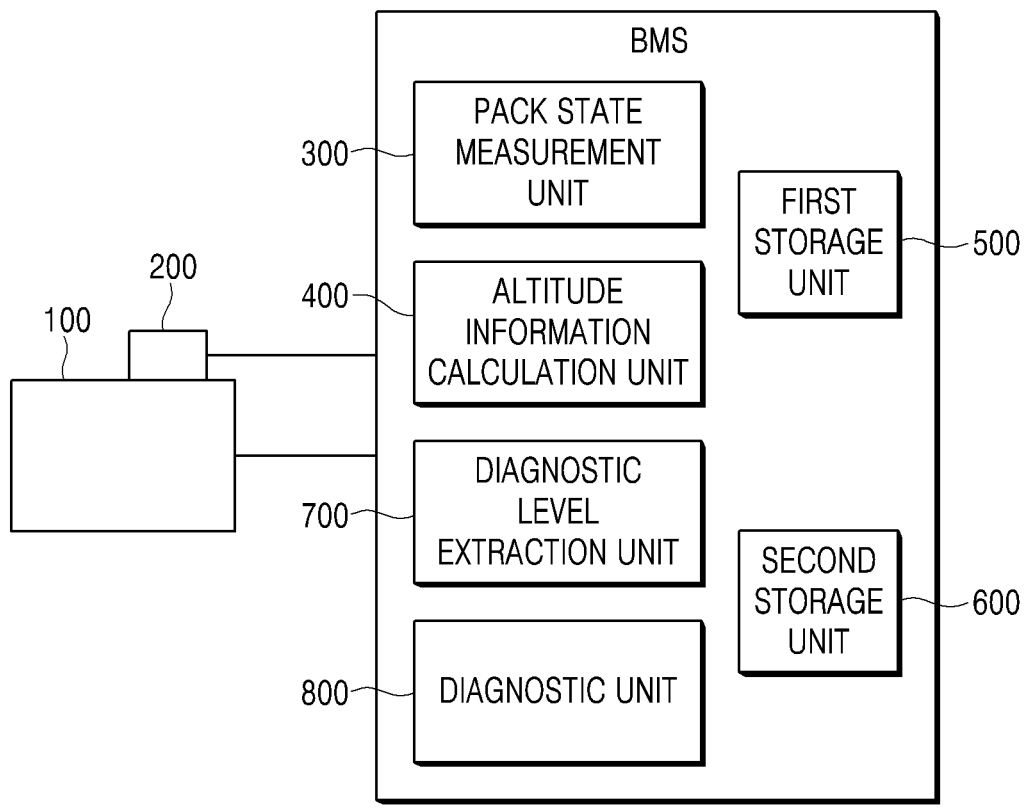
FIG. 1 is a diagram showing the configuration of a battery diagnostic system according to the present invention.
FIG. 2 is a diagram showing an example of a lookup table of altitude-diagnostic level.

Hereinafter, embodiments of the present invention will be described in detail with reference to the accompanying drawings so that those of ordinary skill in the art may easily implement the present invention. However, the present invention may be implemented in various forms and is not limited to the embodiments described herein. In the drawings, parts irrelevant to the description are omitted in order to clearly describe the present invention, and like reference numerals refer to like elements throughout the specification.

Hereinafter, the present invention will be described in detail with reference to the drawings.

1. Battery Diagnostic System According to Present Invention

FIG. 1 is a diagram schematically illustrating the configuration of a battery diagnostic system according to altitude using a barometric pressure sensor according to the present invention. Referring to FIG. 1, the battery diagnostic system according to the present invention includes a battery pack 100, a barometric pressure sensor 200, a pack state measurement unit 300, an altitude information calculation unit 400, a first storage unit 500, a second storage unit 600, a diagnostic level extraction unit 700, and a diagnostic unit 800.

1.1. Battery Pack 100

Battery packs store and provide electrical energy. The battery pack may include a plurality of battery cells (not shown) capable of being charged and discharged. In addition, in the battery pack, a predetermined number of battery cells (not shown) may form a battery module. That is, the battery pack may include at least one battery module, and the battery module may include a plurality of battery cells (not shown). The battery pack in the present invention is, for example, a power supply device that is installed on an electric two-wheeled vehicle that may be used for short-distance movement such as an electric scooter or electric bicycle and supplies power to an electric motor driven for its operation, and may be a battery pack for a Light Electric Vehicle (LEV).

1.2. Barometric Pressure Sensor 200

The barometric pressure sensor is mounted at any one position of the battery pack 100 to measure an external atmospheric pressure state at regular intervals.

Atmospheric pressure varies with height because the effect of gravity is different with height due to atmospheric pressure. Certain countries have many high-altitude zones, and when operating a Light Electric Vehicle (LEV) in such an environment, in the battery pack mounted therein, a change in battery characteristics such as rapid discharge or expansion occurs due to a change in atmospheric pressure according to an altitude increase.

Accordingly, the present invention is to mount a barometric pressure sensor on the battery pack in order to precisely monitor and diagnose the state of the battery pack that changes according to the altitude.

1.3. Pack State Information Measurement unit 300

The pack state information measurement unit is configured to measure the voltage, current, and temperature states of the battery pack 100 at regular intervals. The pack state information measurement unit may be configured to include a voltage measurement unit, a current measurement unit, and a temperature measurement unit (hereinafter, not shown), and may measure voltage, current, and temperature states, respectively, using a variety of known techniques.

1.4. Altitude Information Calculation Unit 400

The altitude information calculation unit is configured to calculate altitude information using the atmospheric pressure measurement value input from the barometric pressure sensor 200.

The calculating of the altitude information may, for example, use a method that includes in advance a lookup table including an altitude value corresponding to each atmospheric pressure value in any one of the first and second storage units 500 and 600 to be described later, and extracts an altitude value corresponding to a current atmospheric pressure value from the lookup table. As another example, a method of calculating the barometric pressure altitude using a signal obtained by converting the atmospheric pressure input from the barometric pressure sensor into an analog voltage may be used. However, the present invention is not limited thereto, and various known techniques capable of calculating current altitude information corresponding to a measurement value from the barometric pressure sensor 200 mounted on the battery pack 100 may be used.

1.5. First Storage Unit 500

The first storage unit stores data including diagnostic level information corresponding to each atmospheric pressure section in the form of a lookup table. For example, as a lookup table as shown in FIG. 2, the diagnosis level may be set in a manner that increases as the altitude increases.

1.6. Second Storage Unit 600

The second storage unit stores predetermined diagnostic reference range data corresponding to each diagnostic level. Here, the diagnostic reference range data is diagnostic reference data for diagnosing states such as overcharge, overdischarge, and overcurrent of the battery pack, and includes respective diagnostic reference values of voltage, current, and temperature of the battery pack. These diagnostic reference range data are differentially set according to the diagnostic level.

For example, in the form of setting the reference range for overvoltage or overcurrent diagnosis by lowering the reference range for overvoltage or overcurrent diagnosis at high altitude compared to low altitude or flat ground, it is to set the diagnostic reference range data by differentiating it step by step according to the altitude.

1.7. Diagnostic Level Extraction Unit 700

The diagnostic level extraction unit is configured to extract a diagnostic level corresponding to the altitude value calculated by the altitude information calculation unit 400 based on a lookup table stored in the first storage unit 500.

More specifically, an altitude section to which the altitude value calculated by the altitude information calculation unit 400 belongs is detected from the lookup table stored in the first storage unit 500, and a diagnosis level corresponding to the detected altitude section is extracted.

For example, referring to FIG. 2, when the current altitude value is 720 m, the corresponding diagnosis level is extracted as 'LV2'.

1.8. Diagnostic Unit 800

The diagnostic unit extracts predetermined diagnostic reference range data corresponding to the diagnostic level corresponding to the current altitude value extracted from the diagnostic level extraction unit 700 from the second storage unit 600 so that the diagnostic unit may diagnose the current state of the battery pack by using the voltage, current, and temperature values measured by the pack state information measurement unit 200 based on the extracted diagnostic reference range data.

As described above, since the characteristics of the battery pack change due to the effect of altitude, in order to diagnose the state of the battery pack in consideration of these changes, this is to differentiate between the diagnostic reference range data that diagnoses the state of the battery pack according to the altitude, and diagnose the state of the battery pack by applying the diagnostic reference range data corresponding to the diagnostic level corresponding to the current altitude.

In this way, after setting the diagnostic reference range data for diagnosing states including overcharging, overdischarging, and overcurrent of the battery pack, differentially according to the altitude, by applying diagnostic reference range data corresponding to the altitude at which the current battery pack is located, the state of the battery pack is diagnosed, so that the state of the battery pack may be more precisely monitored in consideration of battery characteristics that change according to altitude.

On the other hand, the pack state measurement unit 300, the altitude information calculation unit 400, the first storage unit 500, the second storage unit 600, the diagnostic level extraction unit 700, and the diagnostic unit 800 described above may be implemented in a battery management system (BMS).

2. Battery Diagnosis Method According to Present Invention

Figure 3:
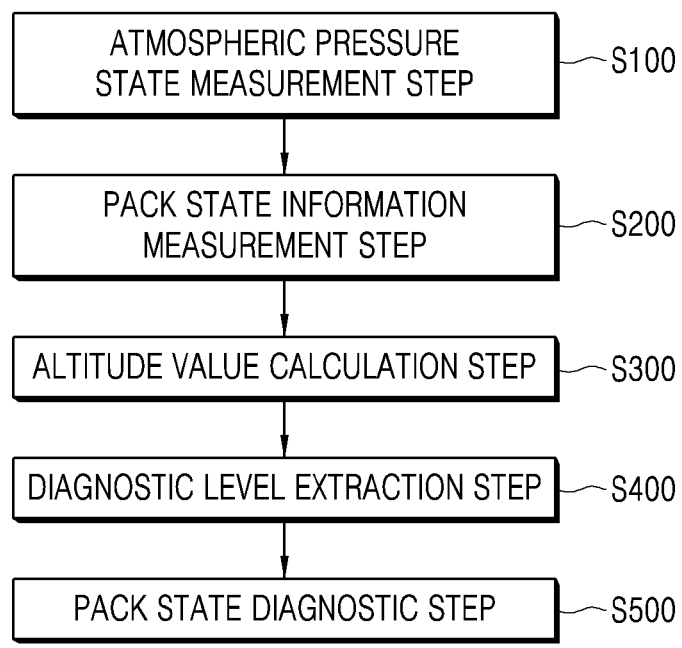
FIG. 3 is a diagram illustrating a sequence of a method for diagnosing a battery according to the present invention.

FIG. 3 is a diagram illustrating a sequence of a battery diagnosis method according to altitude using a barometric pressure sensor according to the present invention. Referring to FIG. 3, the battery diagnosis method of the present invention may be configured as follows.

2.1. Atmospheric Pressure State Measurement Step S100

The atmospheric pressure state measurement step is a step of measuring the atmospheric pressure state outside the battery pack at regular intervals. This step is performed by the barometric pressure sensor 200 mounted at a predetermined position of the battery pack 100.

2.2. Pack State Information Measurement Step S200

The pack state information measurement step is a step of measuring the voltage, current, and temperature states of the battery pack at regular intervals. The voltage, current, and temperature states of the battery pack may be measured using a known method by the pack state measurement unit 300 described above, respectively.

2.3. Altitude Value Calculation Step S300

The altitude value calculation step is a step of calculating an altitude value using the atmospheric pressure measurement value measured in the atmospheric pressure state measurement step (S100). This is performed by the altitude information calculation unit 400.

A method for calculating the altitude value may perform calculation, for example, by using a lookup table including an altitude value corresponding to each atmospheric pressure value provided in advance. However, the present invention is not limited thereto, and any method capable of calculating an altitude value corresponding to the current atmospheric pressure measurement value is possible.

2.4. Diagnostic Level Extraction Step S400

The diagnostic level extraction step is a step of extracting a diagnostic level corresponding to the current altitude value calculated in the altitude value calculation step (S300). In order to consider the change in the characteristics of the battery that occurs according to the altitude change in the state diagnosis of the battery pack, a diagnostic level corresponding to the current altitude value is extracted by using a lookup table that includes diagnostic level information that is differentiated according to altitude. This step may be performed by the diagnostic level extraction unit 700 described above to extract a diagnostic level corresponding to the current altitude value.

2.5. Pack State Diagnostic Step S500

The pack state diagnostic step is a step of diagnosing the current state of the battery pack using the voltage, current, and temperature values measured in the pack state information measurement step S200 based on the predetermined diagnostic reference range data corresponding to the diagnostic level extracted in the diagnostic level extraction step S400.

Since changes occur in the characteristics of the battery pack due to the influence of altitude, in order to diagnose the state of the battery pack in consideration of these changes. This is to differentially set the diagnostic reference range data that diagnoses the state of the battery pack according to the altitude, and diagnose the state of the battery pack based on the diagnostic reference range data corresponding to the diagnostic level corresponding to the current altitude.

On the other hand, although the technical idea of the present invention has been specifically described according to the above embodiment, it should be noted that the above embodiments are for the purpose of explanation and not limitation. In addition, those skilled in the art in the technical field of the present invention will be able to understand that various embodiments are possible within the scope of the spirit of the present invention.

The invention claimed is:

1. A system for diagnosing a state of a battery pack according to altitude, the system comprising:
   a battery pack including at least two battery cells connected in series/parallel;
   a barometric pressure sensor mounted at any one position of the battery pack to measure an external atmospheric pressure state at regular intervals;

an altitude information calculation unit configured to calculate altitude information using an atmospheric pressure measurement value input from the barometric pressure sensor;

a first storage unit configured to store a lookup table including diagnostic level information corresponding to each of a plurality of atmospheric pressure sections;

a second storage unit configured to store predetermined diagnostic reference range data corresponding to each diagnostic level information;

a diagnostic level extraction unit configured to extract a diagnostic level corresponding to a current altitude value calculated by the altitude information calculation unit from the lookup table stored in the first storage unit; and a diagnostic unit configured to diagnose a current state of the battery pack by applying predetermined diagnostic reference range data corresponding to the diagnostic level extracted from the diagnostic level extraction unit among the diagnostic reference range data stored in the second storage unit.

2. The system of claim 1, further comprising a pack state information measurement unit configured to measure voltage, current, and temperature states of the battery pack at regular intervals, wherein the diagnostic unit is configured to diagnose the current state of the battery pack by using the voltage, current, and temperature values measured by the pack state information measurement unit based on the diagnostic reference range data corresponding to the diagnostic level extracted from the diagnostic level extraction unit.

3. The system of claim 1, wherein the state of the battery pack is configured to comprise at least one of overcharge, overdischarge, and overcurrent.

4. The system of claim 1, wherein the diagnostic reference range data stored in the second storage unit are differentially set according to each diagnostic level information.

5. The system of claim 4, wherein the diagnostic reference range data comprises reference data for diagnosing at least one state of overcharge, overdischarge, and overcurrent of the battery pack.

6. A method of diagnosing a state of a battery pack according to altitude, the method comprising:

an atmospheric pressure state measurement step of measuring an atmospheric pressure state at regular intervals in a barometric pressure sensor mounted at a predetermined position of the battery pack;

an altitude value calculation step of calculating an altitude value using an atmospheric pressure measurement value measured in the atmospheric pressure state measurement step;

a diagnostic level extraction step of extracting a diagnostic level corresponding to the altitude value calculated in the altitude value calculation step from a lookup table including a diagnostic level corresponding to each altitude section provided in advance; and a pack state diagnostic step of diagnosing a current state of the battery pack based on diagnostic reference range data corresponding to the diagnostic level extracted in the diagnostic level extraction step among the diagnostic reference range data corresponding to each diagnostic level provided in advance.

7. The method of claim 6, further comprising a pack state information measurement step of measuring voltage, current, and temperature states of the battery pack at regular intervals, wherein the pack state diagnostic step is a step of diagnosing the state of the current battery pack using the voltage, current, and temperature values measured in the pack state information measurement step based on the diagnostic reference range data corresponding to the diagnostic level extracted in the diagnostic level extraction step.

8. The method of claim 6, wherein the state of the battery pack is configured to comprise at least one of overcharge, overdischarge, and overcurrent.

9. The method of claim 6, wherein the diagnostic reference range data are differentially set according to each diagnostic level.

10. The method of claim 9, wherein the diagnostic reference range data comprises reference data for diagnosing at least one state of overcharge, overdischarge, and overcurrent of the battery pack.

* * * * *